US008518719B2

(12) United States Patent
Hiraoka et al.

(10) Patent No.: US 8,518,719 B2
(45) Date of Patent: Aug. 27, 2013

(54) METHOD OF MANUFACTURING ORGANIC ELECTROLUMINESCENCE DEVICE AND METHOD OF SETTING LASER FOCAL POSITION

(75) Inventors: Tomomi Hiraoka, Osaka (JP); Yasuo Segawa, Hyogo (JP)

(73) Assignee: Panasonic Corporation, Osaka (JP)

( * ) Notice: Subject to any disclaimer, the term of this patent is extended or adjusted under 35 U.S.C. 154(b) by 20 days.

(21) Appl. No.: 13/427,302

(22) Filed: Mar. 22, 2012

(65) Prior Publication Data
US 2012/0264235 A1    Oct. 18, 2012

Related U.S. Application Data

(63) Continuation of application No. PCT/JP2011/002149, filed on Apr. 12, 2011.

(51) Int. Cl.
*H01L 21/00* (2006.01)

(52) U.S. Cl.
USPC ........................................ 438/4; 257/E51.018

(58) Field of Classification Search
USPC .................. 438/4, 14, 16, 17; 445/2
See application file for complete search history.

(56) References Cited

U.S. PATENT DOCUMENTS

| 7,234,984 B2 | 6/2007 | Nishikawa et al. |
| 7,258,586 B2 | 8/2007 | Tamura et al. |
| 7,507,590 B2 * | 3/2009 | Konda ............................... 438/4 |
| 7,611,745 B2 | 11/2009 | Nishikawa et al. |
| 2003/0222861 A1 | 12/2003 | Nishikawa et al. |
| 2004/0202777 A1 | 10/2004 | Nishikawa et al. |
| 2005/0215163 A1 | 9/2005 | Tamura et al. |

FOREIGN PATENT DOCUMENTS

| JP | 3154176 | 2/2001 |
| JP | 2003-178871 | 6/2003 |
| JP | 2004-227852 | 8/2004 |
| JP | 2005-276600 | 10/2005 |
| JP | 2008-235177 | 10/2008 |
| JP | 2009-266917 | 11/2009 |
| JP | 2009-277528 | 11/2009 |

* cited by examiner

*Primary Examiner* — Charles Garber
*Assistant Examiner* — Reema Patel
(74) *Attorney, Agent, or Firm* — Greenblum & Bernstein, P.L.C.

(57) ABSTRACT

A method of manufacturing an organic electroluminescence device includes: preparing an organic EL device in which an anode, an organic layer including a luminescent layer, and a cathode formed of a transparent material are stacked in order and which has a shorted defective portion; irradiating the organic EL device with a laser beam from a direction of the cathode; measuring an intensity of radiated light from the organic EL device after the laser beam is absorbed through multiphoton absorption; changing a focal position of the laser beam in a stacking direction for performing the irradiating and measuring, and subsequently determining the focal position of the laser beam in the stacking direction such that the intensity of the radiated light is minimal; and irradiating the determined focal position with the laser beam, so as to solve a defect caused by the shorted defective portion.

12 Claims, 15 Drawing Sheets

METHOD OF MANUFACTURING ORGANIC ELECTROLUMINESCENCE DEVICE AND METHOD OF SETTING LASER FOCAL POSITION

CROSS REFERENCE TO RELATED APPLICATION

This is a continuation application of PCT Patent Application No. PCT/JP2011/002149 filed on Apr. 12, 2011, designating the United States of America. The entire disclosure of the above-identified application, including the specification, drawings, and claims are incorporated herein by reference in its entirety.

BACKGROUND OF THE INVENTION (1) Field of the Invention

The present invention relates to a method of manufacturing an organic electroluminescence device and a method of setting a laser focal position.

(2) Description of the Related Art

Conventionally, in an organic electroluminescence (hereinafter, referred to as an organic EL) device including an organic layer interposed between an anode and a cathode, there is a case where a short circuit is caused between the anode and the cathode due to attachment or mixture of a conductive foreign substance during the manufacturing process. In this case, there is a method of repairing the shorted portion by irradiating the shorted portion with laser (see, for example, Patent References 1 to 4: Japanese Unexamined Patent Application Publication No. 2004-227852; Japanese Unexamined Patent Application Publication No. 2003-178871; Japanese Unexamined Patent Application Publication No. 2005-276600; and Japanese Unexamined Patent Application Publication No. 2008-235177).

Patent Reference 1 discloses detecting a conductive foreign substance attached to an organic EL device and irradiating an organic layer in a region surrounding this foreign substance. This allows insulating the organic layer which is interposed between the anode and the cathode in the organic EL device and to which the foreign substance is attached, so as to form the region into a high resistance region, thus solving the short circuit between the anode and the cathode caused by the foreign substance.

Patent Reference 2 discloses irradiating the portion in which the short circuit is caused by the foreign substance, prior to forming a protection film above the anode and the cathode. This solves to deform or burns off the foreign substance, so as to solve the short circuit between the anode and the cathode.

Patent Reference 3 discloses cutting off, so as to physically separate a part of a cathode including a short circuit between the anode and the cathode, from another portion of the cathode without short circuit, thus solving the short circuit caused between the anode and the cathode by the foreign substance.

Patent Reference 4 discloses irradiating a luminescence defective spot in an organic EL device with a laser such as a femtosecond laser, thus forming a missing portion with which to solve the short circuit.

By the methods of solving the short circuit as disclosed in Patent References 1 to 4 described above, a short-circuit state between the anode and the cathode can be solved. However, also assumed is the case where the irradiated laser is scattered around the shorted portion, and this leads to deformation or alteration of each normal laminated layer included in the organic EL device, causing an opposite effect of decreased luminance efficiency and shortened life of the organic EL device. Accordingly, for the organic EL device having a microstructure, it is important to irradiate the shorted portion with a laser without damaging a periphery of the shorted portion.

For the laser irradiation described above, Patent Reference 5 (Japanese Patent No. 3154176) discloses a method of efficiently irradiating an irradiation target point with a laser. The literature discloses a focal position control method for a laser welder that is capable of detecting the laser light reflected from the welded portion and automatically adjusting the focus based on the intensity thereof. Specifically, the focus control is to measure the intensity of the laser light reflected from the welded portion and minimize the intensity of the reflected laser light by controlling a height of a drive stage based on a predetermined adjustment algorithm such that the result of the measurement does not exceed a threshold. In other words, the method is to irradiate a single-layer material such as a welding material with a laser so as to obtain reflected laser light, and focus the laser on the welded portion by monitoring the reflected laser light. This allows controlling the focal position of the laser beam with respect to the welded object constantly at an optimum position, thus achieving stabilized welding quality and improved efficiency.

SUMMARY OF THE INVENTION

However, in the case of applying the laser focus control method disclosed in Patent Reference 5 to a multilayer such as the organic EL device, multiple reflection light is obtained from each layer interface, which does not allow extracting and monitoring only the laser light reflected from a layer that is an irradiation target point, thus making it difficult to focus the laser on the layer to be irradiated. Accordingly, in the case of using the method of controlling the laser focus as described above, it is difficult to solve the short-circuit state of the organic EL device, so that it is not possible to suppress the damage on a peripheral portion thereof even if the short-circuit state can be solved. Thus, the organic EL device after laser repair cannot ensure performance such as luminance efficiency and product cycle, thus making it difficult to improve repair efficiency and increase manufacturing yield.

An object of the present invention, in view of the problem above, is to provide a method of manufacturing an organic EL device and a method of setting a laser focal position that allow setting a laser focus on a specific layer in a multilayer organic EL device so as to solve a shorted portion reliably and efficiently.

To solve the problem described above, a method of manufacturing an organic electroluminescence (EL) device according to an aspect of the present invention includes: preparing an organic EL device in which a lower electrode layer, an organic layer including a luminescent layer, and an upper electrode layer are stacked in order and in which at least one of the lower electrode layer and the upper electrode layer is formed of a transparent material, the organic EL device including a defective portion; irradiating the organic EL device including the defective portion with a laser beam from a direction of the at least one of the upper and lower electrode layers that is formed of the transparent material; measuring an intensity of radiated light that is light radiated from the organic EL device after the laser beam is absorbed through multiphoton absorption; determining a focal position of the laser beam in a stacking direction such that the intensity of the radiated light is minimal, after changing the focal position of the laser beam in the stacking direction for performing the irradiating and the measuring; and emitting the laser beam onto the organic EL device at the determined focal position in the stacking direction so as to solve a defect caused by the defective portion.

With the method of manufacturing an organic electroluminescence device according to the present invention, it is possible to determine the focal position of the laser beam accurately using the intensity of radiated light that is light radiated through multiphoton absorption or the intensity of radiated light detected at a side of a wavelength shorter than a wavelength of the emitted laser beam, thus reliably solving the short circuit between the anode and the cathode while suppressing occurrence of a damage caused by laser irradiation. This accordingly realizes highly efficient repair and increases manufacturing yield.

BRIEF DESCRIPTION OF THE DRAWINGS

These and other objects, advantages and features of the invention will become apparent from the following description thereof taken in conjunction with the accompanying drawings that illustrate a specific embodiment of the present invention. In the Drawings.

DESCRIPTION OF THE PREFERRED EMBODIMENT

Figure 1:
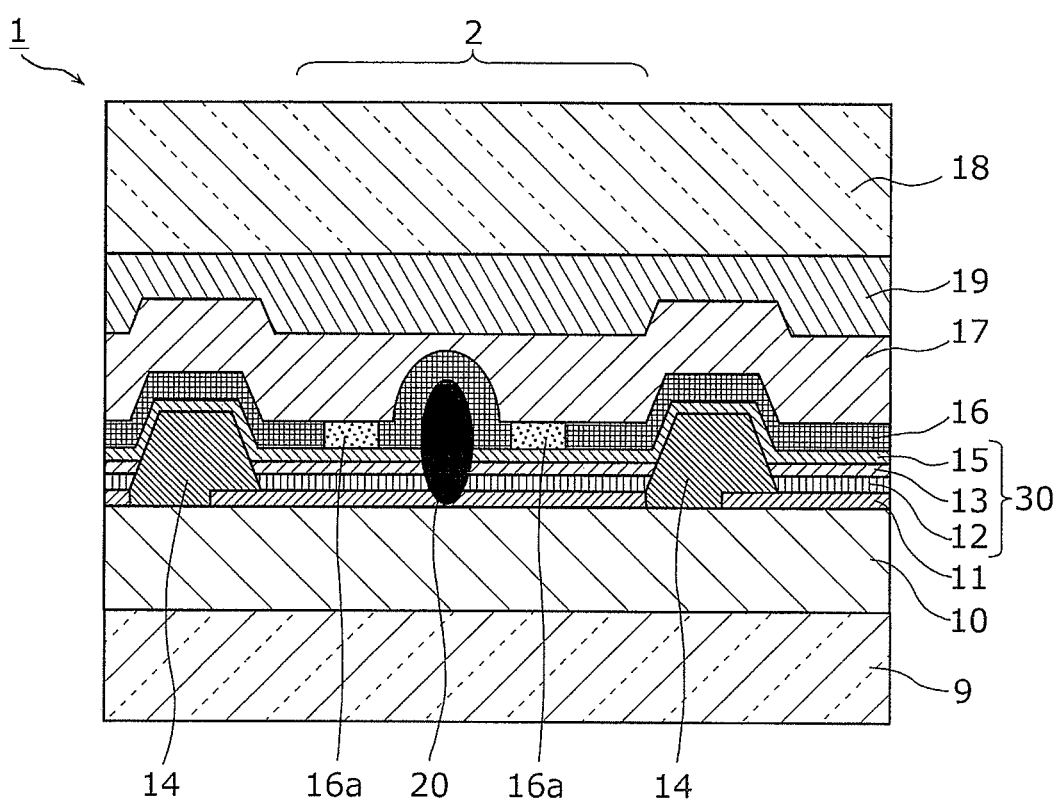
FIG. 1 is a schematic cross-sectional view of an organic EL device according to an embodiment of the present invention.

A method of manufacturing an organic electroluminescence (EL) device according to an aspect of the present invention includes: preparing an organic EL device in which a lower electrode layer, an organic layer including a luminescent layer, and an upper electrode layer are stacked in order and in which at least one of the lower electrode layer and the upper electrode layer is formed of a transparent material, the organic EL device including a defective portion; irradiating the organic EL device including the defective portion with a laser beam from a direction of the at least one of the upper and lower electrode layers that is formed of the transparent material; measuring an intensity of radiated light that is light radiated from the organic EL device after the laser beam is absorbed through multiphoton absorption; determining a focal position of the laser beam in a stacking direction such that the intensity of the radiated light is minimal, after changing the focal position of the laser beam in the stacking direction for performing the irradiating and the measuring; and emitting the laser beam onto the organic EL device at the determined focal position in the stacking direction so as to solve a defect caused by the defective portion.

Conventionally, it is possible to set the laser focus on a single material appropriately by observing light reflected from the single material, that is, the reflected light having the same wavelength as the wavelength of the emitted light. However, the organic EL device is formed of a plurality of very thin stacked layers of dozens of nanometers to hundreds of nanometers, including the anode, the cathode, and an organic layer interposed between them, and such configuration makes it difficult to monitor multiple reflected light from the respective layers so as to focus and irradiate a specific layer with a laser beam.

According to the aspect of the present invention, it is possible to determine the focal position of the laser beam accurately based on the intensity of the radiated light that is radiated from the specific layer through multiphoton absorption, thus allowing focusing the laser beam on the specific layer corresponding to the radiated light. Thus, this allows reliably repairing the short circuit between the anode and the cathode while suppressing occurrence of a damage caused by laser irradiation, thus realizing highly efficient repair and increased manufacturing yield.

In addition, a method of manufacturing an organic electroluminescence (EL) device according to an aspect of the present invention includes: preparing an organic EL device in which a lower electrode layer, an organic layer including a luminescent layer, and an upper electrode layer are stacked in order and in which at least one of the lower electrode layer and the upper electrode layer is formed of a transparent material, the organic EL device including a defective portion; irradiating the organic EL device including the defective portion with a laser beam from a direction of the at least one of the lower and upper electrode layers that is formed of the transparent material; measuring an intensity of radiated light detected at a wavelength shorter than an irradiation wavelength of the laser beam; determining a focal position of the laser beam in a stacking direction such that the intensity of the radiated light is minimal, after changing the focal position of the laser beam in the stacking direction for performing the irradiating and the measuring; and emitting the laser beam onto the organic EL device at the determined focal position in the stacking direction so as to solve a defect caused by the defective portion.

According to the aspect of the present invention, the focal position of the laser beam can be accurately determined based on the intensity of the radiated light that is radiated from the specific layer, thus allowing focusing the laser beam on the specific layer corresponding to the radiated light. Thus, this allows reliably repairing the short circuit between the anode and the cathode along with suppressing occurrence of a damage caused by laser irradiation, thus realizing highly efficient repair and increased manufacturing yield.

In addition, according to an aspect of the present invention, it is preferable that in the measuring, the intensity of the radiated light be measured through an absorption filter that absorbs light having the same wavelength as the wavelength of the laser beam emitted in the irradiating.

According to this aspect of the present invention, the intensity of the radiated light is measured through the absorption filter that absorbs light having the same wavelength as the wavelength of the emitted laser beam, and this allows reliably eliminating the reflected light having the same wavelength as the wavelength of the emitted laser beam, thus allowing measuring only the intensity of the radiated light having a wavelength different from the wavelength of the emitted laser beam and thereby determining the focal position accurately.

In addition, according to an aspect of the present invention, the radiated light measured in the measuring is light radiated from a specific layer among a plurality of layers including the lower electrode layer, the organic layer, and the upper electrode layer, and in the emitting, a position at which the specific layer is located is irradiated with the laser beam as the determined focal position in the stacking direction so as to solve the defect caused by the defective portion.

The radiated light that is radiated after being through multiphoton absorption or having a wavelength shorter than the wavelength of the emitted laser beam has possibility of being radiated from each layer constituting a stacked structure of the organic EL device. According to the aspect of the present invention, the focal position in a stacking direction is specified by associating the wavelength of the emitted light with each layer based on a bandgap and so on of a material constituting each layer and measuring the intensity of the wavelength of the radiated light corresponding to the layer on which the laser beam is intended to focus. This allows, even for the stacked structure such as the organic EL device, monitoring the radiated light corresponding to the specific layer and focusing on to irradiate the specific layer with a laser beam with high efficiency.

In addition, according to an aspect of the present invention, it is preferable that the laser beam be an ultrashort-pulse laser.

According to this aspect of the present invention, it is possible to easily increase resistance of the anode or cathode that is in an amorphous state through irradiation with the ultrashort-pulse laser. It is further possible to increase resistance of a transparent conductive material that cannot be readily processed by another type of laser.

In addition, according to an aspect of the present invention, it is preferable that the emitted laser beam have a wavelength of 750 nm to 1600 nm.

According to this aspect of the present invention, the laser to be used has a wavelength of 750 nm to 1600 nm which is a wavelength range that allows radiation of light radiated through multiphoton absorption or radiated light having a wavelength shorter than the wavelength of the emitted laser beam.

In addition, according to an aspect of the present invention, it is preferable that the radiated light have a wavelength shorter than a wavelength of the emitted laser beam by 3 nm to 50 nm.

Detecting the radiated light within this range clearly indicates the focal position dependence of the detected intensity of the radiated light, thus facilitating determination of the focal position.

In addition, according to an aspect of the present invention, it is preferable that the transparent material be a transparent metal oxide.

With this, since a constituent material for the electrode is a transparent metal oxide, it is possible to increase resistance more reliably by irradiation of the ultrashort-pulse laser.

In addition, according to an aspect of the present invention, it is preferable that one of the lower electrode layer and the upper electrode layer be formed of a high reflection metal.

This causes the laser beam to be reflected off the metal having high reflectivity, thus making it possible to collect, more efficiently, the laser beam onto the layer that is intended to be focused.

In addition, according to an aspect of the present invention, the organic EL device may include a light control layer stacked above the upper electrode layer, and in the irradiating and emitting, the laser beam may be emitted via the light control layer.

For the laser described above, by selecting a wavelength that can be transmitted through the light control layer, it is possible to solve the short circuit via the light control layer.

In addition, according to an aspect of the present invention, it is preferable that the defective portion be a shorted portion in which the lower electrode layer and the upper electrode layer are shorted, and that in the emitting, the defect caused by the defective portion be solved by increasing resistance of a neighborhood of the shorted portion.

According to this aspect of the present invention, the resistance of a part of the lower or the upper electrode is increased by changing the material constituting at least one of the electrodes in the shorted portion and in a neighborhood of the shorted portion. This allows solving the short circuit, so that a voltage can be applied to the organic layer between the anode and the cathode, thus recovering the luminescence of the pixel including the anode, the organic layer, and the cathode.

In addition, the present invention can be realized not only as a method of manufacturing an organic EL device including such a characteristic unit but also as a method of setting a laser focal position using characteristic steps included in the manufacturing method of the organic EL device.

Hereinafter, the organic EL device manufacturing method and the method of setting the laser focal position according to the embodiment of the present invention will be described with reference to the drawings. Note that hereinafter the same element or a corresponding element all through the drawings is assigned with the same numerical reference, and the overlapping description thereof is omitted.

(First Embodiment)
<Device Structure>

FIG. 1 is a schematic cross-sectional view of an organic EL device according to a first embodiment of the present invention. An organic EL device 1 shown in the figure is an organic functional device including an anode, a cathode, and an organic layer interposed between the two electrodes and including a luminescent layer.

As shown in FIG. 1, the organic EL device 1 includes, on a transparent glass 9, a flattening film 10, an anode 11, a hole injection layer 12, a luminescent layer 13, a bank 14, an electron injection layer 15, a cathode 16, a thin-film encapsulating layer 17, an encapsulating resin layer 19, and a transparent glass 18.

The anode 11 and the cathode 16 correspond, respectively, to a lower electrode layer and an upper electrode layer according to the present invention. In addition, the hole injection layer 12, the luminescent layer 13, and the electron injection layer 15 correspond to the organic layer in the present invention.

The transparent glass 9 and 18 are substrates that protect a light-emitting surface of a luminescent panel and are, for example, transparent alkali-free glass having a thickness of 0.5 mm.

The flattening film 10 is made of, as an example, an insulating organic material, and is formed on, for example, a substrate including a thin-film transistor (TFT) for driving.

The anode 11 is an electrode supplied with holes, that is, an electrode in which a current flows from an external circuit, and the anode 11 has a configuration in which, for example, a reflection electrode made of Al, a silver alloy APC, or the like is stacked on the flattening film 10. The reflection electrode has a thickness of 10 nm to 40 nm, for example. Note that the anode 11 may have a two-layer structure made up of, for example, indium tin oxide (ITO) and silver alloy APC. Thus, by forming the anode 11 with a metal having high reflectivity such as APC, the emitted laser beam is reflected by the metal having such highly reflectivity, so that the laser beam can be collected more efficiently to the layer intended to be focused.

The hole injection layer 12 is a layer mainly composed of a hole-injecting material. The hole-injecting material is a material having a function to reliably inject the holes injected from an anode 11 side into the luminescent layer 13 or to support the generation of holes and inject the generated holes into the luminescent layer 13; for example, a compound such as polyethylenedioxythiophene (PEDOT) and aniline is used for the material.

The luminescent layer 13 is a layer which produces luminescence when a voltage is applied between the anode 11 and the cathode 16, and in which for example, α-NPD (Bis[N-(1-naphthyl)-N-phenyl]benzidine) as the lower layer and Alq3 (tris-(8-hydroxyguinoline) aluminum) as the upper layer are stacked.

The hole injection layer 15 is a layer mainly composed of an electron-injecting material. The electron-injecting material is a material having a function to reliably inject electrons from the cathode 16 into the luminescent layer 13 or to support generation of electrons to inject the generated electrons into the luminescent layer 13; for example, polyphenylene vinylene (PPV) is used for the material.

The cathode 16 is an electrode supplied with electrons, that is, an electrode from which a current flows toward an external circuit, and is formed into a stacked structure using, for example, a transparent metal oxide ITO. The cathode 16 can be formed as a more transparent electrode using a material such as Mg and Ag. In addition, the electrode has a thickness of 10 nm to 40 nm, for example.

The bank 14 is a wall for separating the luminescent layer 13 into a plurality of luminescent regions, and is made of, for example, a photosensitive resin.

The thin-film encapsulating layer 17 is made of, for example, silicon nitride, and has a function to shield the luminescent layer 13 and the cathode 16 from vapor and oxygen. This is intended to prevent the luminescent layer 13 itself or the cathode 16 from being deteriorated (oxidized) due to exposure to vapor and oxygen.

The encapsulating resin layer 19 is made of an acrylic resin or epoxy resin, and has a function to junction a layer that is integrally formed on the substrate from the flattening film 10 to the thin-film encapsulating layer 17, and the transparent glass 18.

Such configuration including the anode 11, the luminescent layer 13, and the cathode 16 as described above is a basic configuration of the organic EL device, and when an appropriate voltage is applied between the anode 11 and the cathode 16, holes and electrons are injected into the luminescent layer 13 from the anode 11 and the cathode 16, respectively. These injected holes and electrons are reunited in the luminescent layer 13 to produce energy, which excites a luminescent material in the luminescent layer 13 to produce luminescence.

Note that according to the present invention, the material used for the hole injection layer 12 and the electron injection layer 15 may be, but not limited to, a known organic or inorganic material.

In addition, as a configuration of the organic EL device 1, a hole transport layer may be formed between the hole injection layer 12 and the luminescent layer 13, and an electron transport layer may be formed between the electron injection layer 15 and the luminescent layer 13. In addition, the hole transport layer may be provided instead of the hole injection layer 12, and the electron transport layer may be provided instead of the electron injection layer 15. The hole transport layer is a layer mainly composed of a hole-transporting material. Here, the hole-transporting material is a material having both electron-donating properties that are more likely to generate positive ions (holes) and properties that transport the holes thus generated by intermolecular charge transfer reaction, and is a material appropriate for charge transport from the anode 11 to the luminescent layer 13. The electron transport layer is a layer mainly composed of an electron-transporting material. Here, the electron-transporting material is a material having both electron-accepting properties that are more likely to generate negative ions and properties that transport the electrons thus generated by intermolecular charge transfer reaction, and is a material appropriate for charge transport from the cathode 16 to the luminescent layer 13.

In addition, the organic EL device 1 may further have a configuration in which color filters (light control layer) which adjust colors of red, green, and blue are provided in an undersurface of the transparent glass, to cover the respective luminescent regions separated by the banks 14.

Note that in the present invention, the hole injection layer 12, the luminescent layer 13, and the electron injection layer 15 are integrally referred to as an organic layer 30. In addition, in the case of including the hole transport layer and the electron transport layer, these layers are also included in the organic layer 30. The organic layer 30 has a thickness of 100 nm to 200 nm, for example. In addition, the flattening film 10, the anode 11, the organic layer 30, the cathode 16, the thin-film encapsulating layer 17, and the transparent glass 18 that are provided in the luminescent regions separated by the bank 14 are referred to as a pixel 2.

Furthermore, in the organic EL device 1 shown in FIG. 1, a conductive foreign substance 20 is included between the anode 11 and the cathode 16 in the manufacturing process, and a short circuit occurs between the anode 11 and the cathode 16 via the foreign substance 20. Thus, the short circuit caused between the anode 11 and the cathode 16 by the foreign substance 20 is solved (repaired) by increasing resistance of a cathode portion 16a around the foreign substance 20. The repair processing for the shorted portion is to be described later.

Figure 2:
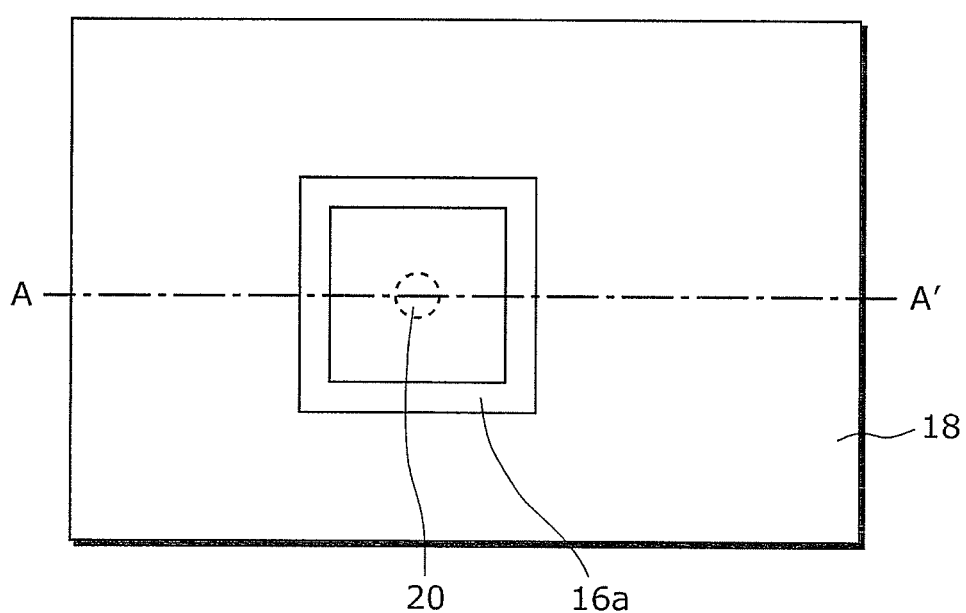
FIG. 2 is a top view of an organic EL device, showing a shape of a cathode with increased resistance.

FIG. 2 is a top view of an organic EL device showing a shape of a cathode with increased resistance. As shown in the figure, according to the present embodiment, the cathode 16 in a predetermined region surrounding the foreign substance 20 is set in focus to be irradiated with a laser. For example, the cathode surrounding the foreign substance 20 at a distance of approximately 10 μm is irradiated with a laser in an angular shape of a 20-μm square, to be formed into the cathode portion 16a with increased resistance.

<Manufacturing Method>

Next, a method of manufacturing the organic EL device 1 will be described.

Figure 3:
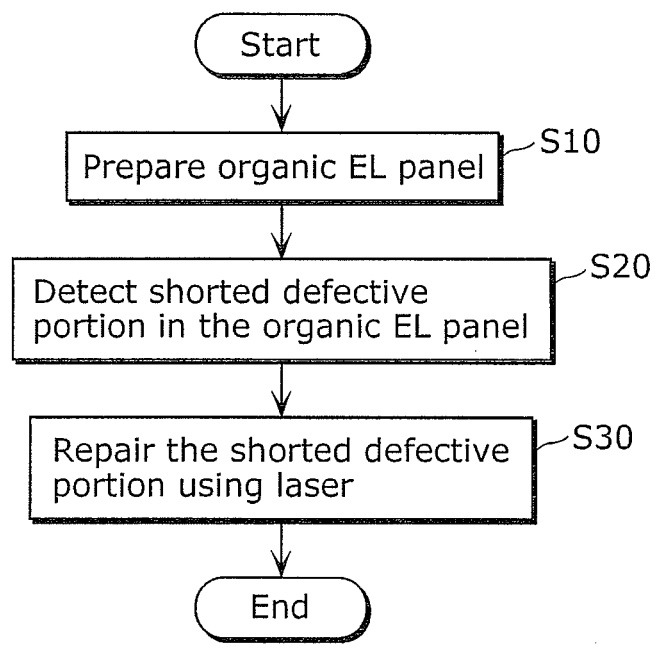
FIG. 3 is a flowchart for describing a method of manufacturing an organic EL device according to the embodiment of the present invention.

FIG. 3 is a flowchart for describing a method of manufacturing an organic EL device according to the present invention.

First, an organic EL panel is prepared (S10). The organic EL panel is made up of pixels arranged in a matrix, in each of which an organic EL device and a drive circuit for driving the organic EL device are formed. This preparation process corresponds to a process of forming, by stacking, organic EL devices included in the pixels arranged in the matrix, and corresponds to the preparing of the organic EL device.

Next, in the organic EL panel including the pixels formed in step S10, the organic EL device included in each pixel is checked to see whether the pixel is in a short-circuit state or not, so as to identify a shorted defective portion that is a portion in a short-circuit state (S20).

Lastly, the shorted defective portion detected in step S20 is repaired by laser irradiation (S30). The processing in step S30 is a characteristic process of the present invention.

With the processing described above, an organic EL panel including high-quality organic EL devices is finished at high manufacturing yield.

The following will describe the three processes described above in detail.

First, a process of preparing the organic EL device (S10) is described.

Figure 4:
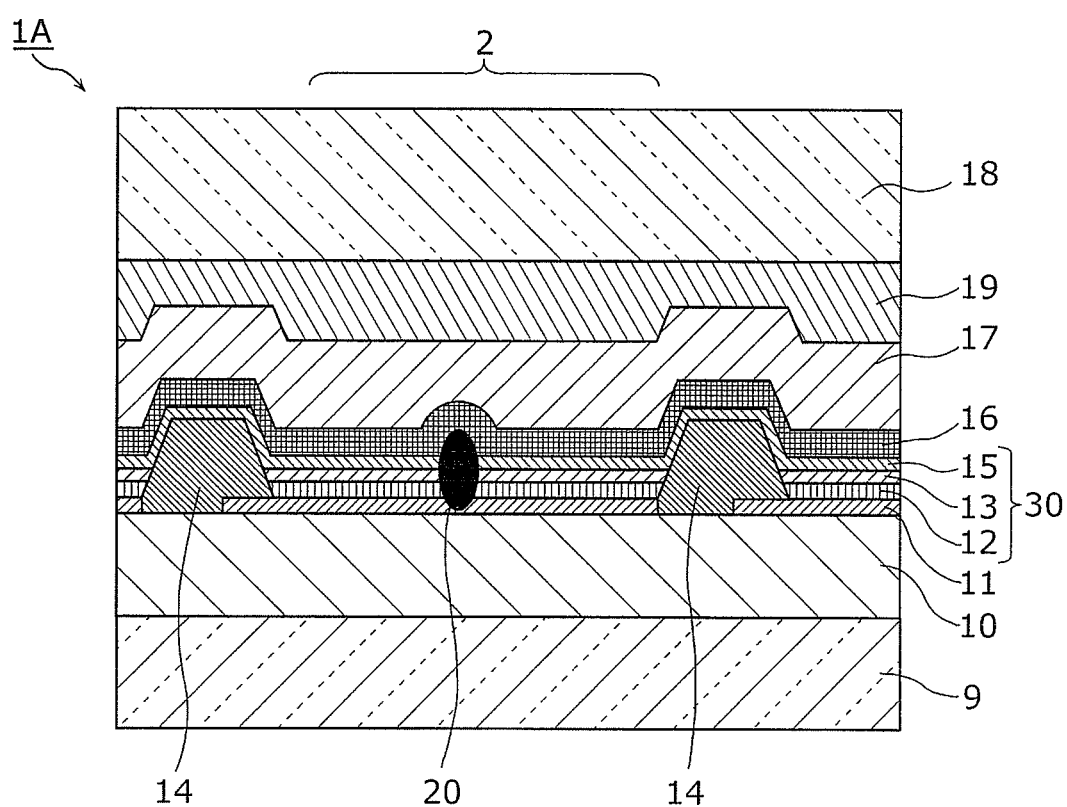
FIG. 4 is a schematic cross-sectional view of an organic EL device prepared in preparing the organic EL device according to the embodiment of the present invention.

FIG. 4 is a schematic cross-sectional view of an organic EL device prepared in the preparing of the organic EL device according to the present invention. The figure shows a cross-sectional configuration of an organic EL device 1A in which the anode 11 and the cathode 16 are shorted due to the foreign substance 20.

First, on a substrate including a TFT, the flattening film 10 is formed using an organic material having insulation properties, and subsequently the anode 11 is formed on the flattening film 10. The anode 11 is formed by, for example, forming a film having a thickness of 30 nm using Al on the flattening film 10 by the sputtering method and subsequently through a patterning process using photolithography and wet etching.

Next, the hole injection layer 12 is formed by, for example, preparing a PEDOT solution by solving PEDOT into a solution including xylene and spin-coating the anode 11 with the solution.

Next, the luminescent layer 13 is formed by, for example, stacking α-NPD and Alq3 on the hole injection layer 12 by the vacuum deposition method.

Next, the electron injection layer 15 is formed by, for example, preparing a solution by solving polyphenylene vinylene (PPV) into a solution including xylene or chloroform and spin-coating the luminescent layer 13 with the solution.

Subsequently, the cathode 16 is formed without exposing, to air, the substrate on which the electron injection layer 15 is formed. Specifically, the cathode 16 is formed by stacking an indium tin oxide (ITO) layer of 35 nm on the electron injection layer 15 by the sputtering method. During this processing, the cathode 16 is in an amorphous state.

According to the manufacturing process described above, an organic EL device having a function as a light-emitting element is formed. Note that between the process of forming the anode 11 and the process of forming the hole injection layer 12, the bank 14 is formed at a predetermined position using a photosensitive resin.

Next, the thin-film encapsulating layer 17 is formed by, for example, stacking a silicon nitride layer of 500 nm on the cathode 16 by a plasma chemical vapor deposition (CVD) method. Since the thin-film encapsulating layer 17 is formed in contact with the surface of the cathode 16, it is preferable to provide a strict requirement for the protection film, and it is also preferable to use a non-oxygenated inorganic material represented by silicon nitride as described above. In addition, for example, the thin-film encapsulating layer 17 may be formed of an oxygenated inorganic material such as a silicon oxide ($Si_xO_y$) and silicon oxynitride ($Si_xO_yN_z$), or may be formed of a plurality of layers using these inorganic materials. In addition, the forming method may be, not limited to the plasma CVD method, another method such as a sputtering method using argon plasma.

Next, the encapsulating resin layer 19 is applied to a surface of the thin-film encapsulating layer 17. Subsequently, the transparent glass 18 is disposed on the encapsulating resin layer 19 that is applied. Here, color filers (light control layer) may be formed in advance in a main surface of the transparent glass 18. In this case, the transparent glass 18 is disposed on the applied encapsulating resin layer 19 such that the surface thereof in which the color filters are formed is oriented downward. Note that the thin-film encapsulating layer 17, the encapsulating resin layer 19, and the transparent glass 18 correspond to the protection layer according to the present invention.

Lastly, the encapsulating resin layer 19 are hardened by applying a heat or energy ray by concurrently pressing down the transparent glass 18 from the upper side, so as to join the transparent glass 18 and the thin-film encapsulating layer 17.

According to the forming method as described above, the organic EL device 1 shown in FIG. 4 is formed.

Note that the process of forming the anode 11, the hole injection layer 12, the luminescent layer 13, the electron injection layer 15, and the cathode 16 is not limited by the present invention.

Next, a process of identifying the shorted defective portion in the organic EL device (S20) is described.

In FIG. 4, the foreign substance 20 is generated when, for example, Al that is a material for the anode 11 is attached on the anode after the anode 11 is formed, and subsequently the hole injection layer 12, the luminescent layer 13, the electron injection layer 15, and the cathode 16 are stacked on the anode 11. The size of the foreign substance 20 is, for example, approximately 200 nm in diameter and 500 nm in height. Since the anode 11 and the cathode 16 are shorted by the foreign substance 20, the organic EL device in this pixel 2 does not produce luminescence, so that the pixel becomes a dark-spot pixel.

Figure 5:
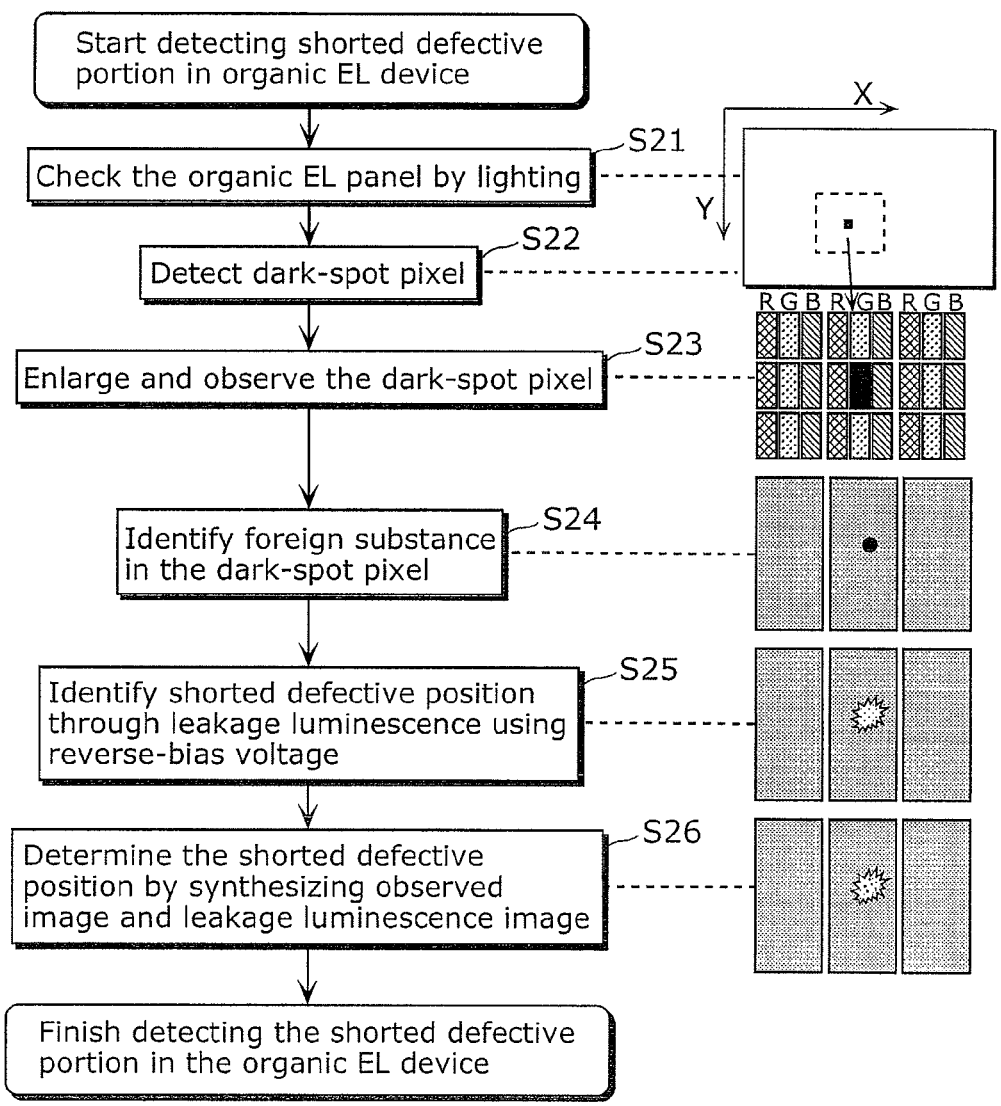
FIG. 5 is an operational flowchart for describing step S20 according to the embodiment of the present invention.

FIG. 5 is an operational flowchart for describing step S20 according to the embodiment of the present invention.

First, lighting check is performed on the organic EL panel formed in step S10 (S21). Specifically, a forward-bias voltage is applied at a time to all the pixels included in the organic EL panel, using a drive circuit included in the organic EL panel or a source meter that is externally connected. At this time, images of all the pixels are captured using a CCD camera and so on at the same time.

Then, luminescence brightness of each pixel is calculated from the captured image during the period in which the forward-bias is applied, so as to detect a pixel having a luminescence brightness lower than a predetermined threshold, that is, a pixel called a dark-spot pixel (S22).

Next, the dark-spot pixel thus detected is enlarged and observed (S23). Specifically, for example, the dark-spot pixel is observed using a microscope camera.

In this observation, the foreign substance 20 is identified in the region of the dark-spot pixel enlarged and observed (S24).

Next, a reverse-bias voltage is applied to the dark-spot pixel detected in step S22, so as to identify a luminescent point producing leakage luminescence (S25). In the normal pixel, the current does not flow in the organic EL device by the reverse-bias voltage, but in the organic EL device having the shorted defective portion, leakage luminescence caused by current leakage can be observed at the shorted point. The leakage luminescent point is specified with reference to the image obtained by capturing this state of leakage luminescence. Specifically, using the drive circuit included in the organic EL panel or a source meter that is externally connected, a predetermined reverse-bias voltage is applied to the pixel to be checked. Then, during the period when the reverse-bias voltage is applied, the point producing leakage luminescence higher than a threshold is identified. Note that since the leakage luminescence caused by the application of the reverse-bias voltage is weak, it is preferable to perform the imaging using the CCD camera and so on in a complete light-shielding environment. Then, by binarizing the luminescence intensity at each imaging point with reference to the threshold intensity, whether the imaging point is the leakage luminescence point or not is determined. Thus, the leakage luminescence point is identified.

Note that the CCD camera should preferably be a cooled CCD camera. This allows securing a predetermined S/N ratio in the imaging of a weak leakage luminescence of the organic EL device. This accordingly eliminates noise in the check, to increase detection accuracy of the defective pixel.

Next, the image of the dark-spot pixel enlarged and observed in step S24 through application of the forward-bias voltage and an image of the leakage luminescence point observed through application of the reverse-bias voltage in step S25 are synthesized, so as to locate the position of the shorted defective portion in the dark-spot pixel (S26).

Note that in the process of locating the position of the shorted defective portion in step S26 described above, the shorted defective portion may be located according to a degree of coincidence between the foreign substance identified through application of the forward-bias voltage and the leakage luminescence point identified through application of the reverse-bias voltage; however, the position of the shorted defective portion may also be located by identifying the foreign substance through application of the forward-bias voltage or identifying the leakage luminescence point through application of the reverse-bias voltage.

In addition, the pixel including the shorted defective portion may also be detected by, not limited to the method described above, a magnitude of a current value obtained by measuring a value of the current flowing between the anode 11 and the cathode 16 in the organic EL device. In this case, the pixel may be determined as the dark-spot pixel if a current value equivalent to that of the normal pixel can be obtained in the pixel through application of the forward-bias voltage, and leakage luminescence is observed in the pixel through application of the reverse-bias voltage.

Next, a process of repairing the shorted defective portion in the organic EL device by laser irradiation (S30), which is a main part of the present invention, will be described.

This process is performed not by monitoring reflected light having the same wavelength as the wavelength of the emitted laser beam but by setting the laser focal point on a specific layer by monitoring light radiated from the specific layer in multi-layer films included in the organic EL device. The radiated light described above is generated through multiphoton absorption in the specific layer, and can have a wavelength region unique to the specific layer. Accordingly, in performing highly-efficient laser irradiation on the specific layer, it is possible to focus the laser on the specific layer by adjusting a distance between a laser source and the specific layer while monitoring the radiated light corresponding to the specific layer.

Note that the light radiated after being through multiphoton absorption as described above is associated with each layer based on a bandgap and so on of the material included in each layer, but the radiated light is not limited to this. Even when the radiated light is determined as not being through multiphoton absorption, such radiated light is still within a scope of the manufacturing method according to the present invention as long as the radiated light has a shorter wavelength than the emitted laser beam and can be associated with each layer so as to determine the focal position in the Z-direction.

Figure 6:
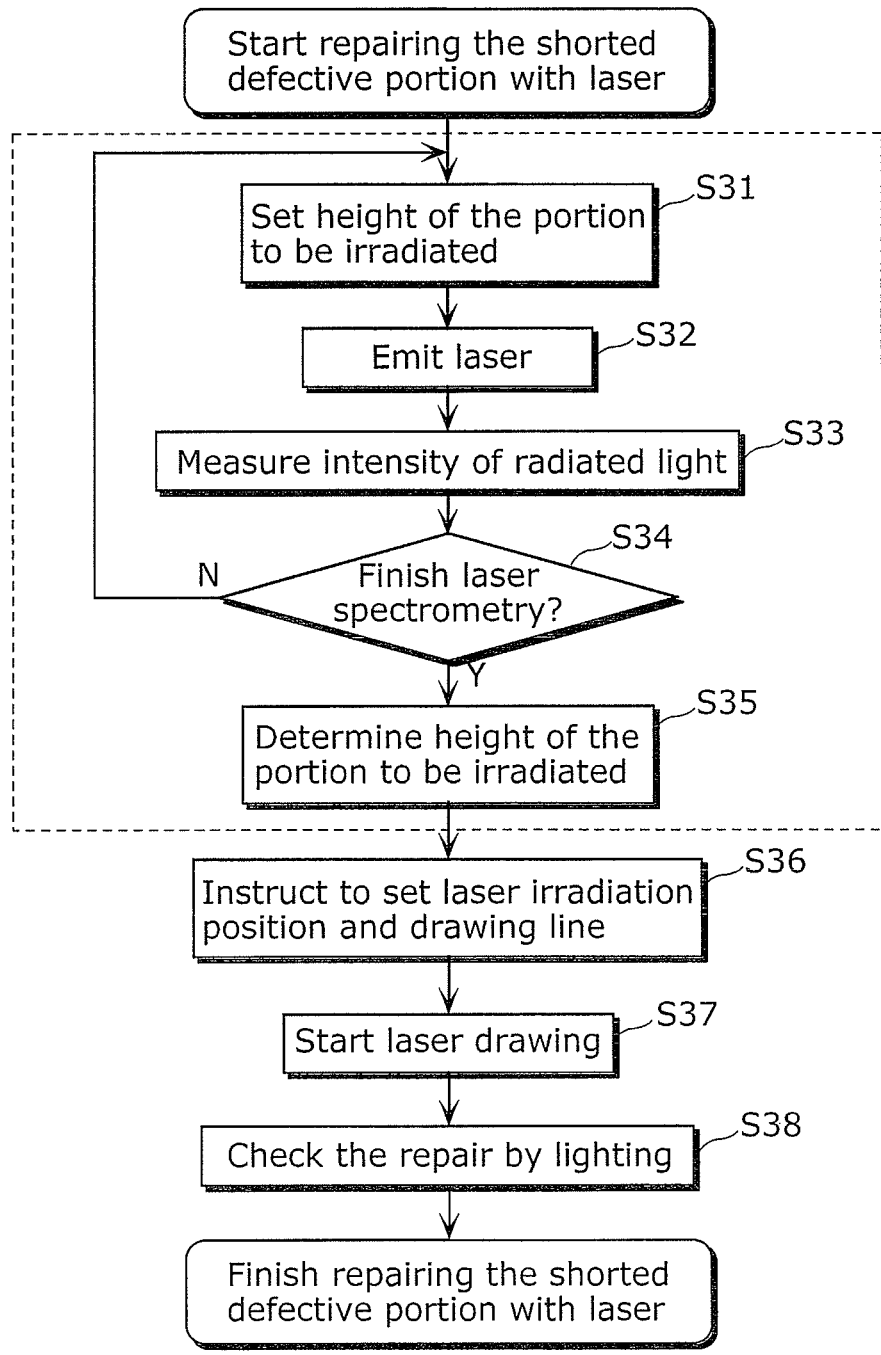
FIG. 6 is an operational flowchart for describing step S30 according to the embodiment of the present invention.
Figure 7:
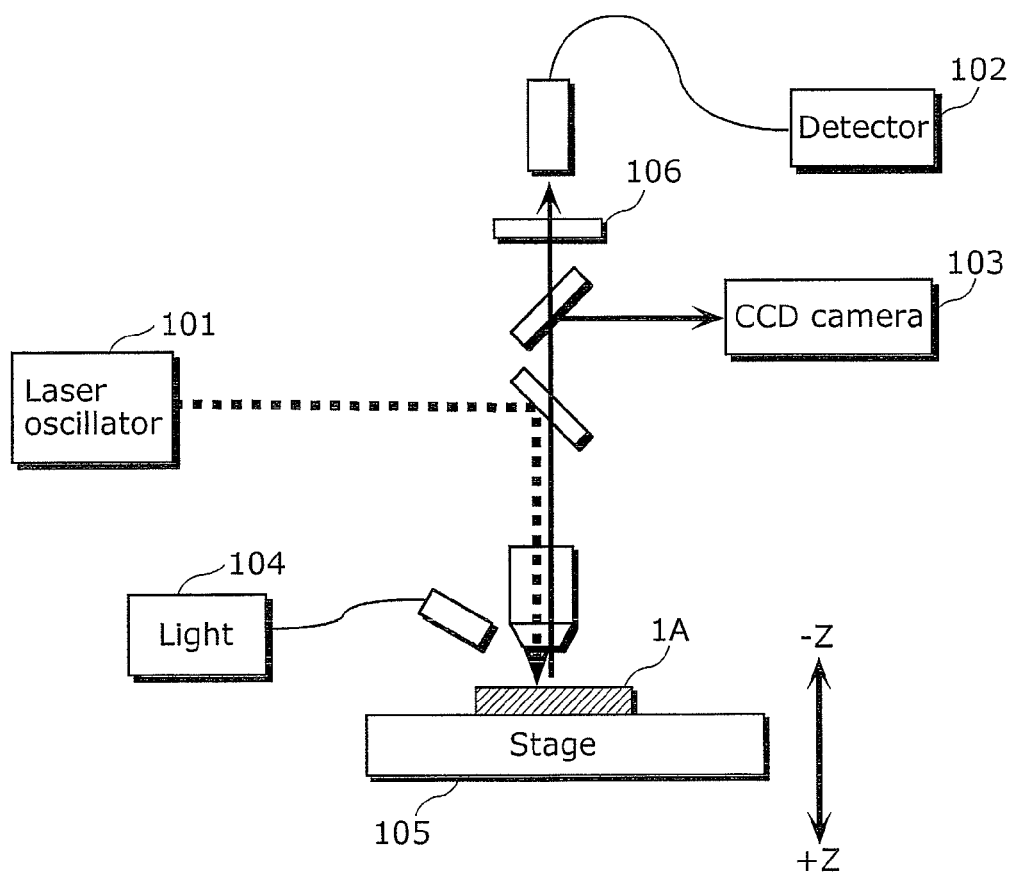
FIG. 7 is a system configuration diagram for performing laser repair according to the embodiment of the present invention.

FIG. 6 is an operational flowchart for describing step S30 according to the embodiment of the present invention. In addition, FIG. 7 is a system configuration diagram for performing laser repair according to the embodiment of the present invention. The system shown in FIG. 7 includes: a laser oscillator 101; a detector 102; a CCD camera 103; a light 104; a stage 105; and an absorption filter 106. In addition, the organic EL panel including the organic EL device 1A is set in place on the stage 105.

The laser oscillator 101 is capable of oscillating an ultrashort-pulse laser having, for example, a wavelength of 750 nm to 1600 nm, output energy of 1 µJ to 30 µJ, and a pulse width of the order of several femtoseconds to the order of several picoseconds. Such ultrashort-pulse laser includes, for example, a femtosecond laser, and a preferable pulse width is 100 fs to 20 ps. By irradiation with such ultrashort-pulse laser, it is possible, in particular, to readily increase the resistance of the anode or cathode that is in an amorphous state. Furthermore, it is possible to increase resistance of a transparent conductive material that cannot be readily processed by another type of laser.

In the embodiment, the laser is focused on the cathode 16 so as to increase the resistance of a part of the cathode 16. In this processing, a range of output energy that allows increasing the resistance of the part of the cathode 16 depends on the wavelength of the laser to be emitted. When the cathode 16 is irradiated with a laser having excessive output energy, the laser reaches the organic layer 30 under the cathode 16, to cause damage to the organic layer 30. In addition, when the cathode 16 is irradiated with a laser having very low output energy, the resistance of the cathode 16 is not increased. In addition, when irradiated with a laser having a pulse width of 20 psec or more, the organic layer 30 will be damaged. Considering all of these, it is possible to readily increase resistance of a part of the cathode 16 by irradiating the organic EL device with a laser having a wavelength within the range of the laser wavelength described above and having a pulse width within the range of the pulse width described above.

The detector 102 is a spectrometer which disperses the light radiated from the organic EL device as a result of laser irradiation.

The CCD camera 103 is a monitor that monitors a surface of the organic EL panel on the stage 105, so as to adjust a height Z and a plane direction of the stage 105 accurately.

The light 104 has a function to support observation of a surface state of the organic EL panel and a laser irradiation state.

The stage 105 is movable in a height direction Z as well as in plane directions X and Y, and has a function to set an object to be repaired by laser in place.

The absorption filter 106 has a function to absorb light having the same wavelength as the emitted laser beam so as to prevent the emitted laser beam from being transmitted to reach the detector 102 side.

The following will describe the repair process (530) in detail according to the flowchart in FIG. 6.

First, a height of the organic EL device to be repaired is set (S31). Specifically, an operator visually sets a position in the Z-direction by watching an image captured by the CCD camera 103.

Next, at the Z-position thus set, the organic EL panel is irradiated with a guide beam having the same wavelength as the wavelength of the laser beam or the laser beam itself (S32).

The step S32 described above corresponds to irradiating the organic EL device 1A with a laser beam from the cathode side.

Next, at the Z-position that is set, the radiated light from the organic EL panel is measured by the detector 102 using spectrometry (S33).

The step S33 described above corresponds to measuring the intensity of the light radiated from the organic EL device 1A after the laser beam is through multiphoton absorption.

The steps S31 to S33 described above are performed at different Z-positions. Thus obtained is a spectrum detected by spectrometry at each Z-position.

Figure 8:
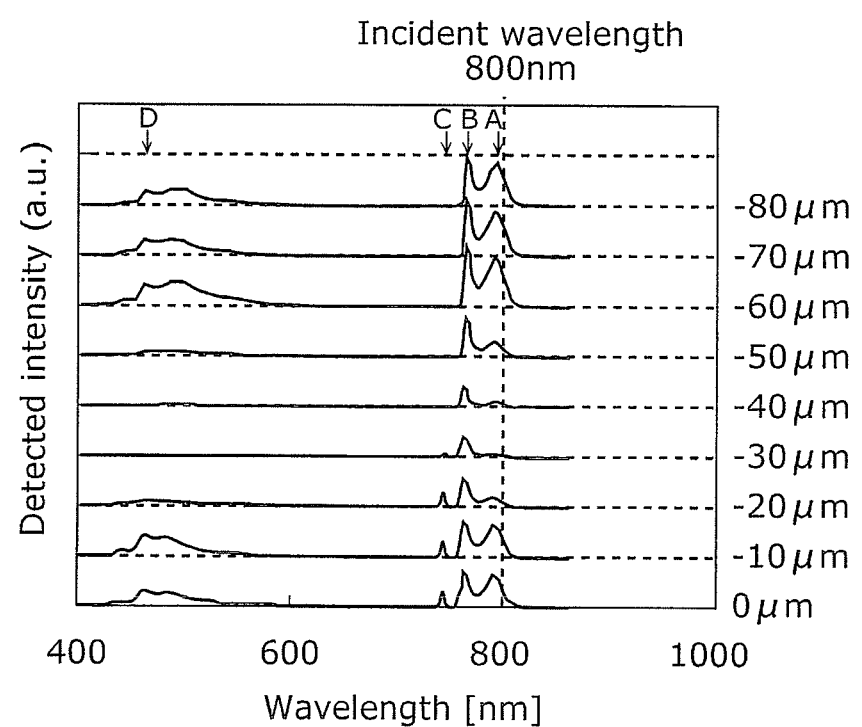
FIG. 8 is a diagram showing optical spectra of the radiated light measured with respect to a height direction as a parameter.

FIG. 8 is a diagram showing optical spectra of the radiated light measured with respect to the height direction as a parameter. In the present embodiment, the laser beam is assumed to have an incident wavelength of 800 nm. In the graph shown in the figure, a horizontal axis represents a wavelength of the light radiated from the organic EL device and a vertical axis represents the detected intensity of the radiated light. Note that the detected intensity is displaced in the vertical direction so as to compare the optical spectra measured at the respective Z-positions. From the optical spectra in the figure, mainly four peak wavelengths are detected (A to D in FIG. 8).

Figure 9:
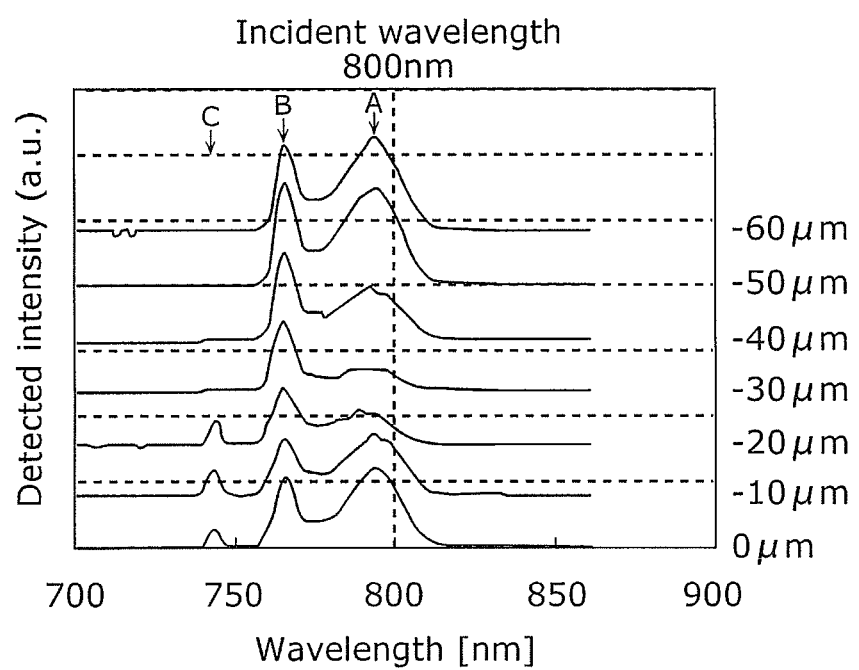
FIG. 9 is a diagram showing optical spectra of the radiated light measured with respect to the height direction as a parameter.

FIG. 9 is a diagram showing an enlarged view of optical spectra of the radiated light measured with respect to the height direction as a parameter. As shown in the figure, each of the peak wavelengths observed in the optical spectra is located at a shorter wavelength than the incident wavelength of the laser beam. It is assumed that each stacked layer in the organic EL device is excited through multiphoton absorption by the incident laser beam and is caused to radiate light having a shorter wavelength than the wavelength of the incident laser beam. Assuming that the emission peaks shown in FIGS. 8 and 9 are caused by the multiphoton absorption described above, by considering the bandgap and so on of each layer in the stacked film, Peak A corresponds to the radiated light from an interface between the cathode 16 (ITO) and the electron injection layer 15, Peak B corresponds to the radiated light from the electron injection layer 15, Peak C corresponds to the radiated light from the cathode 16 (ITO), and Peak D corresponds to the radiated light from the luminescent layer 13.

Figure 10:
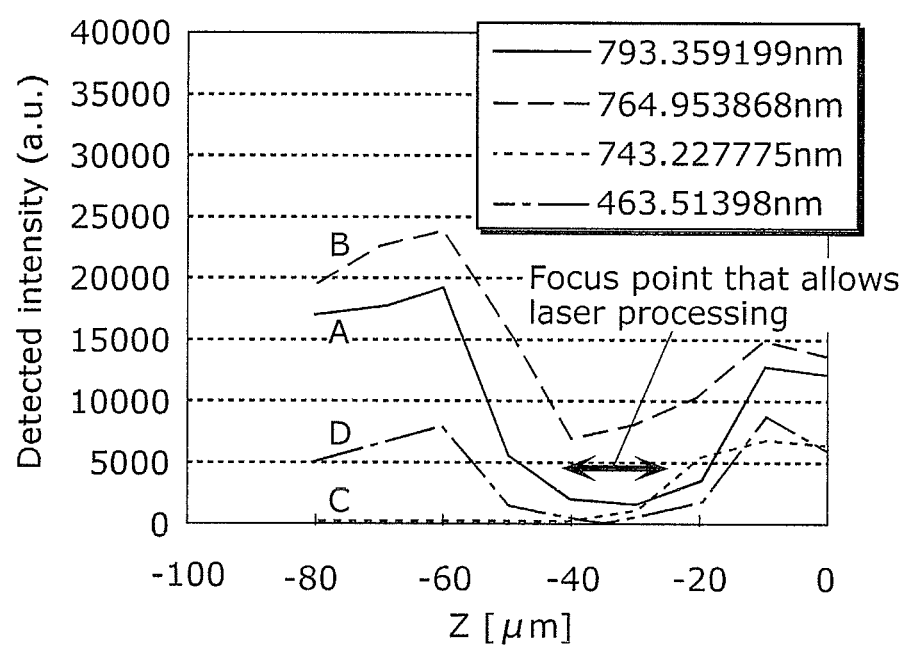
FIG. 10 is a graph showing a Z-position dependence of the detected intensity of the radiated light.

FIG. 10 is a graph showing a Z-position dependence of the detected intensity of the radiated light. FIG. 10 shows, in the optical spectra in FIGS. 8 and 9, a plotted relationship between the Z-position and the detected intensity in each peak wavelength, focusing on the four peak wavelengths of the radiated light as described above. In FIG. 10, the detection intensity has the Z-position dependence, and the amount of the radiation through multiphoton absorption is small near the Z-position at which the detected intensity is minimal. The small amount of radiation through multiphoton absorption near the Z-position at which the detection intensity is minimal means that the laser focused and emitted is absorbed with high efficiency by the irradiated object located at the Z-position. For example, in peak wavelengths A and B having a high Z-position dependence, the detection intensity is minimal when the Z-position is approximately −30 μm to −40 μm. In particular, the peak wavelength A indicates a low intensity of the radiated light at the Z-position where the detected intensity is minimal, and accordingly it is possible to efficiently focus is the incident laser beam on the interface between the cathode 16 (ITO) and the electron injection layer 15 by setting the Z-position to −30 μm to −40 μm.

Note that the Z-position at which the detected intensity is minimal is not limited by the Z-position at which the detected intensity is minimal in the graph representing the dependence on the Z-position in FIG. 10, but is defined as a range of a predetermined Z-position including the Z-position at which the detected intensity is minimal.

Note that the wavelength of the radiated light should preferably be a wavelength shorter than the wavelength of the emitted laser beam by 3 nm to 50 nm. Detecting the radiated light within this range clearly indicates the focal-position dependence of the detected intensity of the radiated light, thus facilitating determination of the focal position.

Back to FIG. 6 again, the laser repair process will be described.

Next, a height of the stage for performing the laser repair is determined (S35). Specifically, an optimal Z-position for the laser repair is determined according to the Z-position dependence of the detected intensity of the radiated light in each peak wavelength of the radiated light shown in FIG. 10. In the example described above, by specifying the Z-position as −30 μm to −40 μm, it is possible to efficiently focus the incident laser beam having a wavelength of 800 nm on the interface between the cathode 16 (ITO) and the electron injection layer 15.

The step S35 described above corresponds to determining a focal position of a laser beam in a stacking direction, at which the radiated light intensity is minimal.

Next, a laser irradiation position and a drawing line are set (S36). Specifically, as shown in FIG. 2, according to the present embodiment, in order to perform laser irradiation on the cathode 16 in a predetermined region surrounding the foreign substance 20, the drawing line in the plane direction is set such that a region of the cathode 16, which surrounds the foreign substance 20 at a distance of approximately 10 μm, is irradiated with a laser in an angular shape of a 20-μm square.

Next, according to the stage height determined in step S35 and the drawing line in the plane direction set in step S36, laser drawing is started (S37).

Figure 11A:
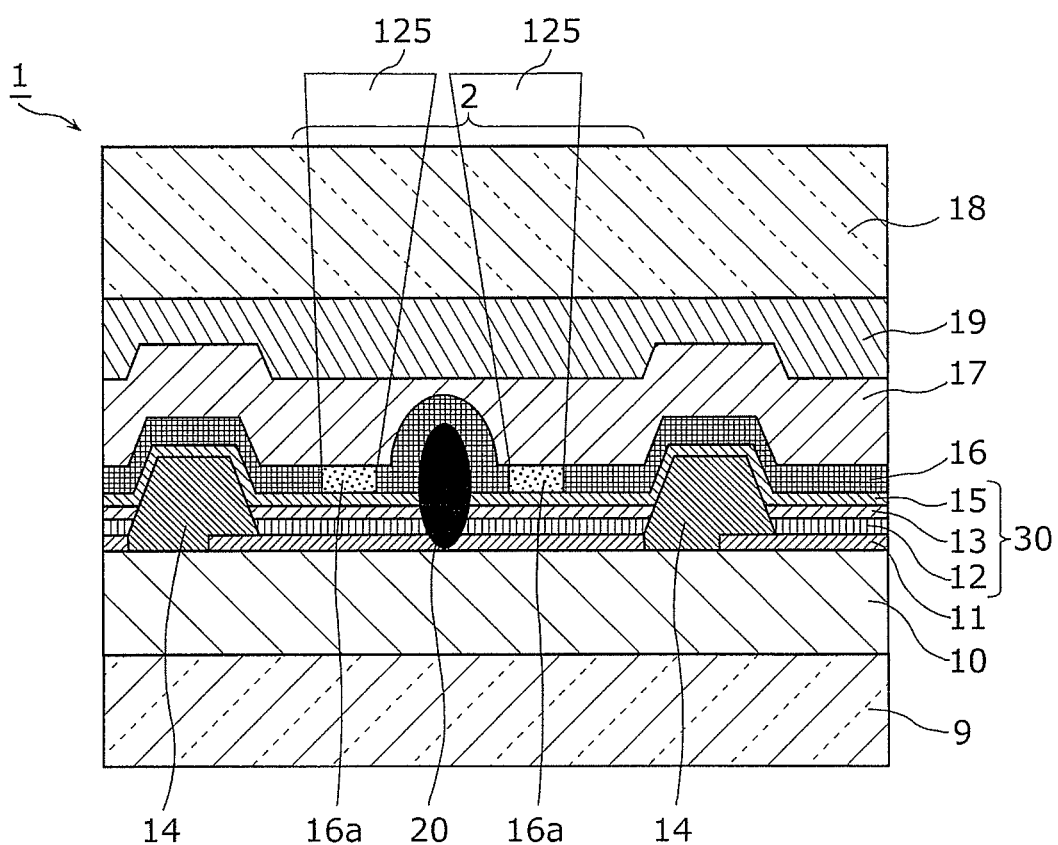
FIG. 11A is a schematic cross-sectional view of an organic EL device during laser irradiation.

FIG. 11A is a schematic cross-sectional view of the organic EL device during laser irradiation. As shown in the figure, a laser 125 is emitted onto the area around the shorted defective portion, surrounding the shorted defective portion including the foreign substance 20 so that a cathode region that is electrically shorted with the foreign substance 20, that is, the cathode region surrounded by the cathode portion 16a is insulated from the other cathode region and is shorted with the anode 11 via the foreign substance 20. With this, a current path flowing between the anode 11 and the cathode 16 is not generated in the cathode region surrounded by the cathode portion 16a, but is normally generated in a cathode region other than the surrounded cathode region.

The step S37 described above corresponds to emitting the laser beam onto the organic EL device at the determined position in the stacking direction as the focal position of the laser beam in the stacking direction, so as to solve the defect caused by the shorted defective portion.

Lastly, it is checked by lighting whether or not the pixel including the shorted defective portion has been repaired by the laser repair described above (S38).

Figure 11B:
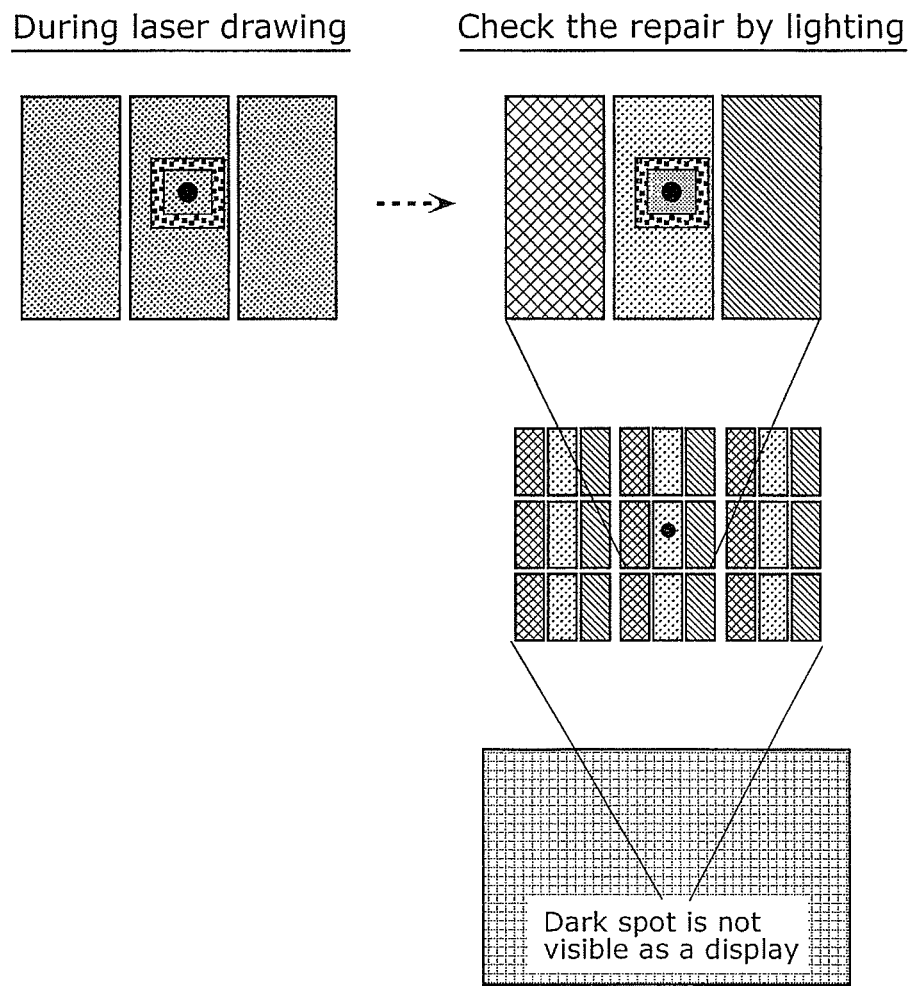
FIG. 11B is a diagram showing a luminescent state of pixels at the time of laser drawing and at the time of repair check by lighting.

FIG. 11B is a diagram showing a luminescent state of a pixel at the time of laser drawing and at the time of repair check by lighting. During the laser drawing in step S37, as long as the drawing line is not connected, the pixel including the shorted defective portion does not produce luminescence even when the forward-bias voltage is applied. On the other hand, in the repair check by lighting after completion of the drawing line, the forward-bias voltage is applied to see that the region surrounded by the drawing line does not produce luminescence but the other regions produce luminescence. When this is checked across the entire organic EL luminescent panel, even if the region in the shape of the 20-μm square is not luminescent, such non-luminescent portion is not visually recognized, so that image quality of the organic EL panel is enhanced.

Conventionally, although appropriate laser focusing on a single material has been possible by observing the light reflected from the single material, it has been difficult to use the technique for the organic EL device because the organic EL device is formed by stacking a plurality of ultrathin layers of several scores nm to several hundreds nm including the anode, the cathode, and the organic layer interposed between them, so that it is difficult to monitor multiple reflection light from the respective layers and perform laser irradiation focusing on a specific layer.

In contrast, according to the method of manufacturing the organic EL device 1 as described above, it is possible to accurately determine the focal position of the laser beam based on the intensity of the radiated light from the specific layer after being through multiphoton absorption, thus allowing reliably solving the short circuit between the anode and cathode while suppressing occurrence of damage caused by laser irradiation. This accordingly realizes highly efficient repair and increases manufacturing yield.

Note that in the method of manufacturing the organic EL device 1 as described above, the steps S31 to S35 for determining the Z-position may be performed immediately before the laser repair, or may be separately performed in advance as common steps for a plurality of organic EL panels, instead of being performed immediately before the laser repair process in steps S36 to S38.

<First Variation>

Figure 12:
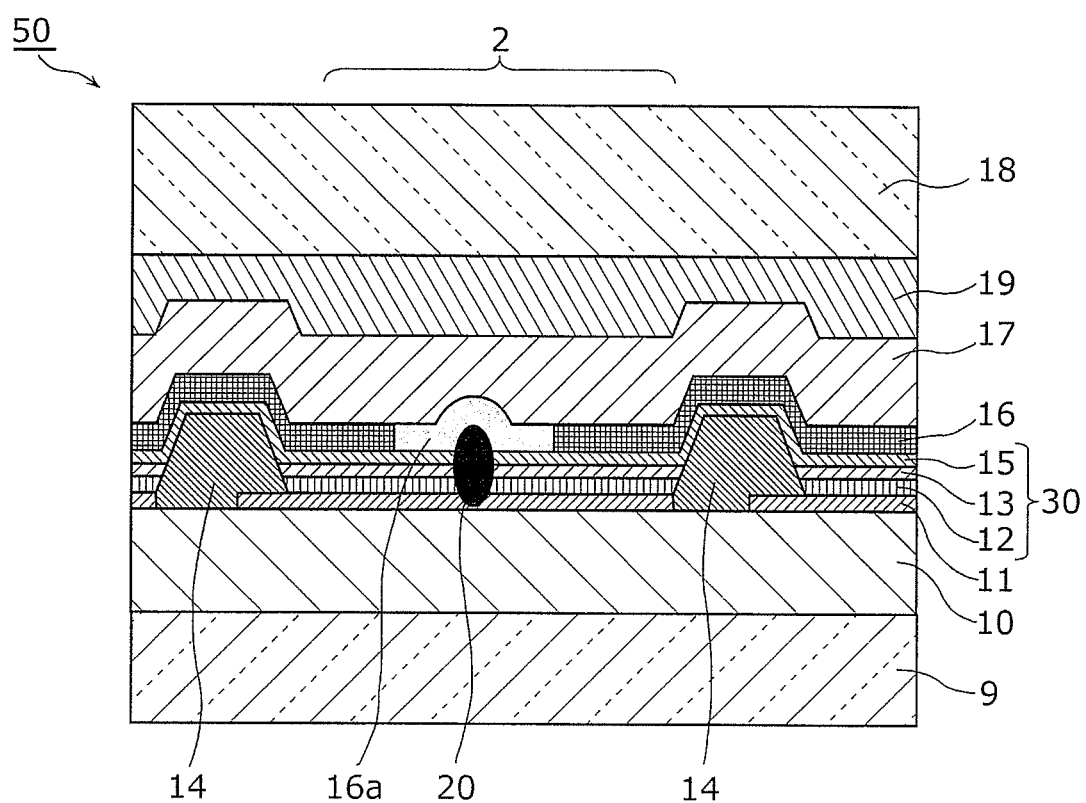
FIG. 12 is a schematic cross-sectional view of an organic EL device according to a first variation of the embodiment of the present invention.

FIG. 12 is a schematic cross-sectional view of an organic EL device according to a first variation of the embodiment of the present invention. An organic EL device 50 according to the present variation and the organic EL device 1 according to the embodiment described above are different from each other only in the region to be irradiated with the laser, but are the same in the stacked structure of the device and the state of occurrence of the foreign substance. The following omits the description of the same point as in the embodiment described above, and only the difference will be described. In the embodiment described above, after being through the optimization process in the Z-direction by monitoring the specific radiated light, laser irradiation is performed in an angular shape of a square surrounding the foreign substance 20; whereas, in the present variation, laser irradiation is performed on the entire square region including the foreign substance 20.

Note that in the present variation, in advance of the laser irradiation to increase the resistance of the square region, the Z-position of the organic EL device 50 is determined by performing the steps S31 to S35 as shown in FIG. 6. This allows reliably solving the short circuit between the anode and the cathode while suppressing occurrence of damage caused by laser irradiation.

By the laser irradiation according to the present variation, the resistance of the cathode region including the foreign substance 20 can be increased, and the cathode region is insulated from the other cathode region. With this, a current path that flows between the anode 11 and the cathode 16 is not generated in the cathode region including the foreign substance 20, but the current path is normally generated in a cathode region other than the irradiated cathode region.

<Second Variation>

Next, a second variation of the embodiment of the present invention will be described. An organic EL device 60 according to the present variation is different from the organic EL device 1 according to the embodiment described above in that: the anode and the cathode are directly in contact to cause a short circuit without being through a conductive foreign substance, and this shorted portion is intended to be repaired.

Figure 13:
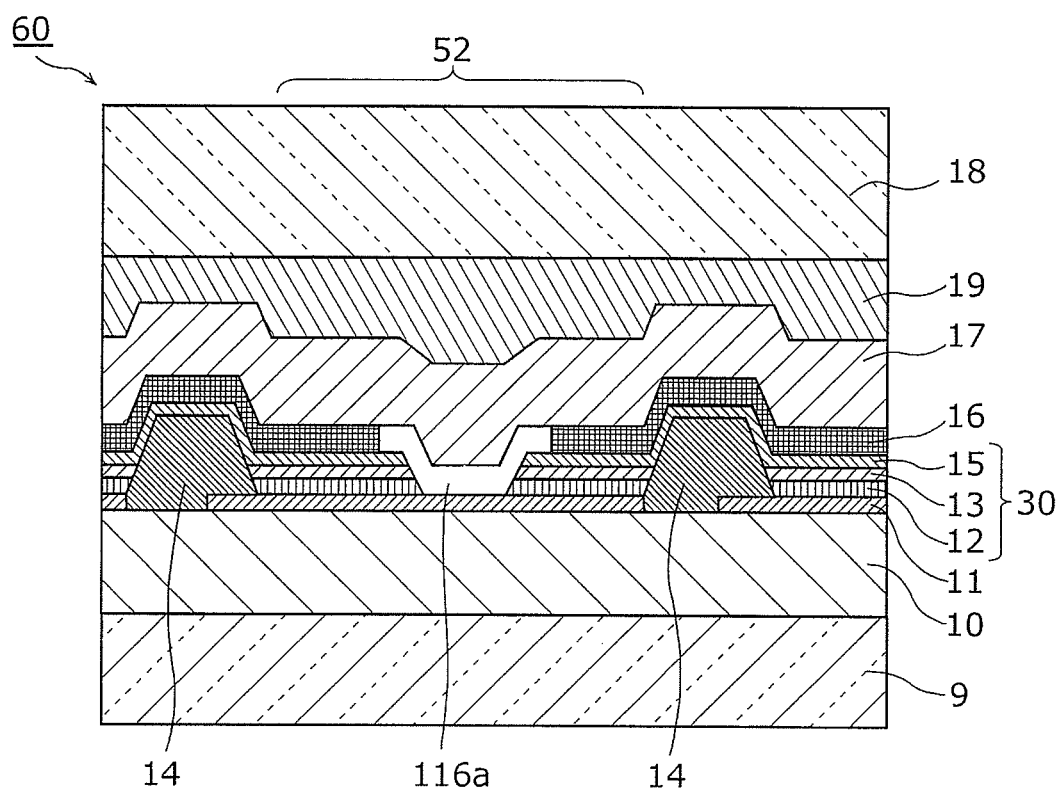
FIG. 13 is a schematic cross-sectional view of an organic EL device according to a second variation of the embodiment of the present invention.

FIG. 13 is a schematic cross-sectional view of an organic EL device according to the second variation of the embodiment of the present invention. Since the stacked structure of the organic EL device 60 shown in the figure is the same as that of the first embodiment, the description thereof is omitted. In FIG. 13, the anode 11 and the cathode 16 are directly in contact with each other at the cathode portion 116a. This direct contact is caused, for example, as a result of a pinhole being formed at the short-circuit position in the process of forming the organic layer 30 and subsequently the cathode 16 being formed by pouring a material for forming the cathode 16 into the pinhole in forming the cathode 16. Then, by increasing the resistance of the cathode portion 116a, the configuration allows solving the short circuit between the anode 11 and the cathode 16 that are shorted. In the embodiment described above, after being through the optimization process in the Z-direction by monitoring the specific radiated light, laser irradiation is performed in an angular shape of a square surrounding the foreign substance 20, whereas in the present variation, laser irradiation is performed on the entire square region including the pinhole portion as described above.

Note that also in the present variation, before increasing the resistance of the square region by laser irradiation, the Z-position of the organic EL device 60 is determined by performing the steps S31 to S35 shown in FIG. 6. This allows reliably solving the short circuit between the anode and the cathode while suppressing occurrence of damage caused by laser irradiation.

By the laser irradiation according to the present variation, the cathode region including the pinhole region is insulated from the anode 11. With this, a current path that flows between the anode 11 and the cathode 16 is not generated in the cathode region including the pinhole portion, but is normally generated in a cathode region other than the cathode region including the pinhole portion.

Note that the present invention in not limited to the embodiment and the variations described above, but may be modified and varied in various ways without departing from the scope of the present invention.

For example, in the embodiment described above, it has been assumed that the configuration includes the lower electrode as the anode and the upper electrode as the cathode, but the configuration may also be such that the lower electrode is included as the cathode and the upper electrode is included as the anode. In addition, the constituent elements of the organic EL device, such as the flattening film, the anode, the hole injection layer, the luminescent layer, the bank, the electron injection layer, the cathode, the thin-film encapsulating layer, the encapsulating resin layer, and the transparent glass are not limited to those in the present embodiment described above but may be changed in material, composition, and forming method. For example, a hole transport layer may be formed between the hole injection layer and the luminescent layer, and an electron transport layer may be formed between the electron injection layer and the luminescent layer. In addition, in the configuration, color filters (light control layer) which adjust colors of red, green, and blue may be provided in the undersurface of the transparent glass, to cover the respective luminescent regions separated by the banks. Since the femtosecond laser described above can be transmitted through the color filter, it is possible to solve the short circuit through the color filter.

In addition, the laser irradiation position is not limited to the embodiment described above but may be set to a predetermined range including the foreign substance or the shorted portion, or may be set only to the foreign substance or the shorted portion. In addition, the position may be set to surround the foreign substance or the shorted portion. In addition, the laser irradiation may be performed not only on the cathode but also on the anode.

In addition, the present invention is also applicable as a method of setting a laser focal position by: irradiating with a laser beam, by changing the focal position of the laser beam toward the stacking direction, a light-emitting element in which a lower electrode layer, a luminescent layer, and an upper electrode layer are stacked in order and at least one of the lower and the upper electrodes is formed of a transparent material; measuring, each time the focal position is changed in the stacking direction, the intensity of the radiated light that is radiated from the light-emitting element after the laser beam is absorbed through multiphoton absorption; and determining the focal position of the laser beam in the stacking direction such that the intensity of the radiated light is minimal.

According to the method of setting the laser focal position as described above, it is possible to accurately determine the focal position of the laser beam corresponding to the intensity of the radiated light that is radiated from a specific layer after the laser beam is absorbed through multiphoton absorption, so that it is possible to focus the laser beam on the specific layer corresponding to the radiated light. Accordingly, this allows reliably performing laser processing on the specific layer while suppressing occurrence of damage caused by laser irradiation, thus realizing highly efficient processing to increase manufacturing yield.

Figure 14:
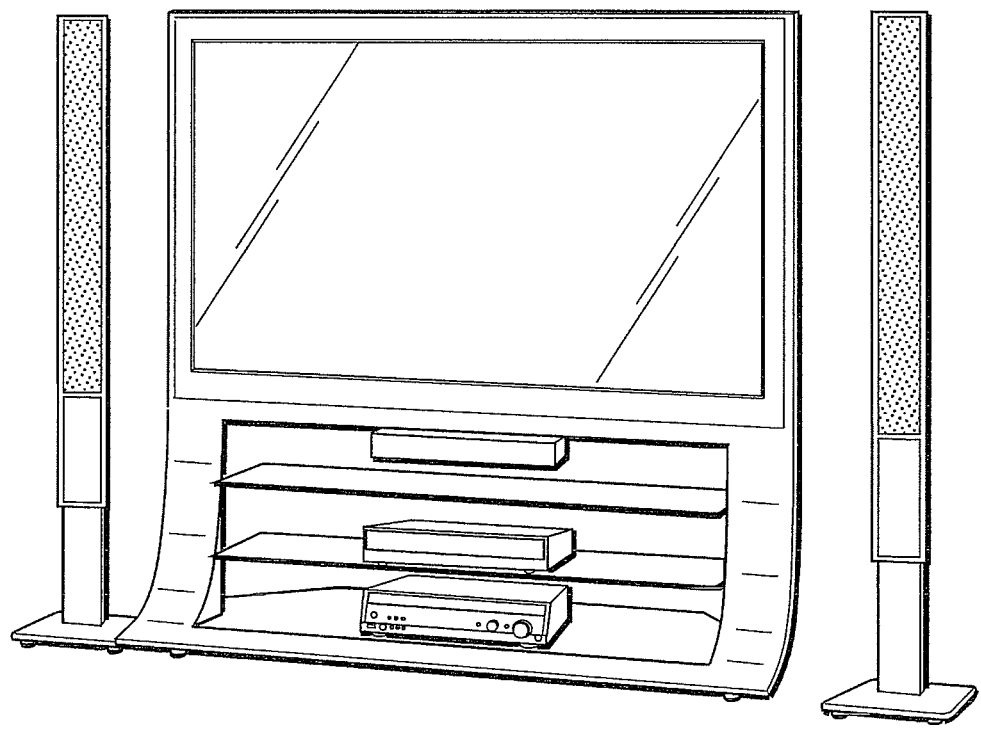
FIG. 14 is an external view of a television system including an organic EL device according to the embodiment of the present invention.

In addition, any variation conceived and applied to the present embodiment by those skilled in the art, any combination of constituent elements in different embodiments and variations thereof are all within the scope of the present invention. The present invention is suitable for manufacturing a flat thin-screen television system including an organic EL device as shown in FIG. 14.

Although only an exemplary embodiment of the present invention has been described in detail above, those skilled in the art will readily appreciate that many modifications are possible in the exemplary embodiment without materially departing from the novel teachings and advantages of the present invention. Accordingly, all such modifications are intended to be included within the scope of the present invention.

Industrial Applicability

A method of manufacturing an organic EL device and a method of setting a laser focal position according to the present invention are useful, in particular, in a technical field such as a thin-screen television or a personal computer display that requires a larger screen and higher resolution.

What is claimed is:

1. A method of manufacturing an organic electroluminescence (EL) device, comprising:
    preparing an organic EL device in which a lower electrode layer, an organic layer including a luminescent layer, and an upper electrode layer are stacked in order and in which at least one of the lower electrode layer and the upper electrode layer is formed of a transparent material, the organic EL device including a defective portion;
    irradiating the organic EL device including the defective portion with a laser beam from a direction of the at least one of the upper and lower electrode layers that is formed of the transparent material;
    measuring an intensity of radiated light that is light radiated from the organic EL device after the laser beam is absorbed through multiphoton absorption;
    determining a focal position of the laser beam in a stacking direction such that the intensity of the radiated light is minimal, after changing the focal position of the laser beam in the stacking direction for performing the irradiating and the measuring; and
    emitting the laser beam onto the organic EL device at the determined focal position in the stacking direction so as to solve a defect caused by the defective portion.

2. The method of manufacturing an organic EL device according to claim 1,
    wherein in the measuring, the intensity of the radiated light is measured through an absorption filter that absorbs light having the same wavelength as the wavelength of the laser beam emitted in the irradiating.

3. The method of manufacturing an organic EL device according to claim 1,
    wherein the radiated light measured in the measuring is light radiated from a specific layer among a plurality of layers including the lower electrode layer, the organic layer, and the upper electrode layer, and
    in the emitting, a position at which the specific layer is located is irradiated with the laser beam as the determined focal position in the stacking direction so as to solve the defect caused by the defective portion.

4. The method of manufacturing an organic EL device according to claim 1,
    wherein the laser beam is an ultrashort-pulse laser.

5. The method of manufacturing an organic EL device according to claim 1,
    wherein the emitted laser beam has a wavelength of 750 nm to 1600 nm.

6. The method of manufacturing an organic EL device according to claim 1,
    wherein the radiated light has a wavelength shorter than a wavelength of the emitted laser beam by 3 nm to 50 nm.

7. The method of manufacturing an organic EL device according to claim 1,
    wherein the transparent material is a transparent metal oxide.

8. The method of manufacturing an organic EL device according to claim 1,
    wherein one of the lower electrode layer and the upper electrode layer is formed of a high reflection metal.

9. The method of manufacturing an organic EL device according to claim 1,
    wherein the organic EL device includes a light control layer stacked above the upper electrode layer, and
    in the irradiating and emitting, the laser beam is emitted via the light control layer.

10. The method of manufacturing the organic EL device according to claim 1,
wherein the defective portion is a shorted portion in which the lower electrode layer and the upper electrode layer are shorted, and
in the emitting, the defect caused by the defective portion is solved by increasing resistance of a neighborhood of the shorted portion.

11. A method of manufacturing an organic electroluminescence (EL) device, comprising:
preparing an organic EL device in which a lower electrode layer, an organic layer including a luminescent layer, and an upper electrode layer are stacked in order and in which at least one of the lower electrode layer and the upper electrode layer is formed of a transparent material, the organic EL device including a defective portion;
irradiating the organic EL device including the defective portion with a laser beam from a direction of the at least one of the lower and upper electrode layers that is formed of the transparent material;
measuring an intensity of radiated light detected at a wavelength shorter than an irradiation wavelength of the laser beam;
determining a focal position of the laser beam in a stacking direction such that the intensity of the radiated light is minimal, after changing the focal position of the laser beam in the stacking direction for performing the irradiating and the measuring; and
emitting the laser beam onto the organic EL device at the determined focal position in the stacking direction so as to solve a defect caused by the defective portion.

12. A method of setting a laser focal position, comprising:
irradiating, with a laser beam, a light-emitting element in which a lower electrode layer, a luminescent layer, and an upper electrode layer are stacked in order and in which at least one of the lower electrode layer and the upper electrode layer is formed of a transparent material, the laser beam being emitted from a direction of the at least one of the lower and upper electrode layers that is formed of the transparent material;
measuring an intensity of radiated light that is light radiated from the light-emitting element after the laser beam is absorbed through multiphoton absorption; and
determining a focal position of the laser beam in a stacking direction such that the intensity of the radiated light is minimal, after changing the focal position in the stacking direction of the laser beam for performing the irradiating and the measuring.

* * * * *